United States Patent [19]
Vigne

[11] Patent Number: 5,937,339
[45] Date of Patent: Aug. 10, 1999

[54] FREQUENCY-SELECTION DEVICE PROVIDED WITH A LOCK-ON DETECTOR

[75] Inventor: Alain Vigne, Caen, France

[73] Assignee: U.S. Philips Corporation, New York, N.Y.

[21] Appl. No.: 08/888,679

[22] Filed: Jul. 7, 1997

[30] Foreign Application Priority Data

Jul. 24, 1996 [FR] France .................................. 96 09308

[51] Int. Cl.$^6$ .............................. H04B 1/06; H04B 7/00
[52] U.S. Cl. .................. 455/260; 455/150.1; 455/180.3; 455/183.1; 331/1; 375/354; 375/359; 375/376
[58] Field of Search ................. 455/260, 75, 76, 455/77, 105, 119, 12, 125, 136, 137, 139, 150.1, 151.2, 165.1, 173.1, 178.1, 180.3, 181.1, 182.1, 182.3, 183.1, 188.1, 192.3, 227; 375/326, 327, 354–376; 331/1.16, 20, 21

[56] References Cited

U.S. PATENT DOCUMENTS

| | | | |
|---|---|---|---|
| 4,355,416 | 10/1982 | Malerba | 455/186 |
| 4,596,025 | 6/1986 | Satoh | 375/107 |
| 4,982,110 | 1/1991 | Yokogawa et al. | 307/269 |
| 5,128,632 | 7/1992 | Erhart et al. | 331/1 |
| 5,682,605 | 10/1997 | Salter | 455/54.1 |

Primary Examiner—Curtis A. Kuntz
Assistant Examiner—Binh K. Tieu
Attorney, Agent, or Firm—Edward W. Goodman

[57] ABSTRACT

A frequency-selection device, for selecting a radio-electric signal RF from a number of signals having frequencies which are situated in a given range, includes an oscillator OSC supplying a signal Vco having a variable frequency, a mixer M receiving the radio-electric signal RF and the output signal Vco from the oscillator OSC and supplying a signal FI having a frequency which is equal to the difference between the frequencies of the two signals, a frequency divider DIV supplying a signal Vco/R having a frequency which is equal to the frequency of the output signal Vco from the oscillator OSC, divided by a number R defined by a control signal CMD, a phase detector PD comparing the frequency of the output signal Vco/R from the frequency divider DIV with that of a reference signal Vref and adjusting the frequency of the output signal Vco from the oscillator OSC in the case of difference. This frequency-selection device supplies a signal SYNC which is active when the output signal Vco/R from the frequency divider DIV and the reference signal Vref are synchronous.

8 Claims, 5 Drawing Sheets

FREQUENCY-SELECTION DEVICE PROVIDED WITH A LOCK-ON DETECTOR

BACKGROUND OF THE INVENTION

1. Field of the Invention

The invention relates to a frequency-selection device having a first input intended to receive a radio-electric signal whose frequency is referred to as radio frequency, this radio-electric signal being selected from a number of signals having frequencies which are situated in a given range, said device having a second input intended to receive a control signal defining the frequency of the radio-electric signal to be selected, a first output intended to supply a signal whose frequency, referred to as intermediate frequency, is fixed, and a second output intended to supply a signal indicating that the radio frequency corresponds to the frequency defined by the control signal, said device comprising:

- an oscillator having a tuning input intended to receive a tuning signal, and an output intended to supply a signal whose frequency depends on the value of the tuning signal,
- a mixer having a first input constituting the first input of the device and intended to receive the radio-electric signal, a second input connected to the output of the oscillator, and an output constituting the first output of the device and intended to supply a signal whose frequency is equal to the difference between the frequency of the signal received at the first input and that of the signal received at the second input,
- a frequency divider having a first input connected to the output of the oscillator, a second input constituting the second input of the device, and an output intended to supply a signal whose frequency is equal to the frequency of the signal received at the first input, divided by a number defined by the control signal received at the second input and,
- a phase detector having a first input intended to receive a reference signal having a fixed frequency, a second input connected to the output of the frequency divider, and an output connected to the input of the oscillator.

2. Description of the Related Art

Such devices are commonly used in receiver units incorporated in television sets or radio telephones. In these devices, the phase detector synchronizes the signals which it receives at its two inputs. If it is unable to synchronize said signals, it supplies a tuning signal to the oscillator so as to correct the frequency of its output signal. When the frequency of the output signal of the oscillator allows selection of the radio-electric signal whose frequency corresponds to the required radio frequency which is defined by the control signal, which situation is referred to as "lock-on", the output signal of the frequency divider is in phase with the reference signal, and the phase detector no longer supplies the tuning signal to the oscillator. In the majority of existing frequency-selection devices, this absence of the tuning signal is detected and indicates the lock-on.

The tuning signal is generated in accordance with certain requirements. It is most frequently intended to start charge pumps which allow modification of the bias of certain elements of the oscillator. The particular shape of the tuning signal which results from these requirements does not allow a precise lock-on detection.

SUMMARY OF THE INVENTION

It is an object of the invention to remedy this lack of precision to a large extent by proposing a frequency-selection device in which the synchronism between the output signal of the frequency divider and the reference signal is detected and indicates the lock-on.

A frequency-selection device according to the invention is characterized in that the device also comprises means for generating a window signal which is active during certain time intervals each including an active edge of the output signal of the frequency divider, and a flip-flop having a data input, a clock input and a data output, the data input being intended to receive the window signal, the clock input being intended to receive the reference signal, and the data output constituting the second output of the device.

When the output signal of the frequency divider and the reference signal are synchronous, i.e., in the lock-on situation, the window signal frames the active edges of the reference signal. Consequently, the output of the flip-flop is set at the active level, thus signaling the lock-on.

A variant of the invention renders such a frequency-selection device immune to situations in which an active edge of the reference signal would occur accidentally during a time interval in which the window signal would be active without the device being in a lock-on state.

In such a variant, a frequency-selection device as described above is characterized in that it comprises a digital low-pass filter arranged between the data output of the flip-flop and the second output of the device.

In a particular embodiment of this variant, this frequency-selection device is characterized in that the digital filter comprises:

- a modulo-M counter having a counting/initialization authorization input connected to the output of the flip-flop, a clock input intended to receive the reference signal, and P outputs, with $M=2^P$, an active level at the counting/initialization authorization input authorizing the counter to count, an inactive level setting each output of the counter at the inactive level and,
- a detection module having P inputs connected to the P outputs of the counter, and an output constituting the second output of the device, intended to supply a signal which is set at the active level when all the outputs of the counter are at the active level and is maintained at this level until the counter receives an inactive level at its counting/initialization authorization input.

There is a multiple number of possible modes of obtaining the window signal. A variant of the invention proposes an advantageous mode in that it requires no supplementary components. This variant provides a frequency-selection device as described above, in which the frequency divider is composed of N elementary modules arranged in cascade and each having a data input, a data output and a pulse output, the input of the first elementary module constituting the first input of the frequency divider, each elementary module being intended to operate a frequency division and to supply at its data output a signal resulting from this division and, at its pulse output, a signal which, during each period of the output signal of the frequency divider, is active during the first active state of the input signal, and inactive otherwise, and is characterized in that, if the output of the $i^{th}$ elementary module, in which i may vary between 1 and N, is selected by means of the control signal received at the second input of the frequency divider for forming the output of said divider, the window signal is one of the signals supplied to the pulse output of one of the i first elementary modules.

This variant exploits the delays induced by the cascade arrangement of the elementary modules. Indeed, the signal present at the output of each elementary module has a given delay with respect to the signal present at its input. This delay is sufficient for the active edges of the output signal of an elementary module to be framed by the signal supplied by the pulse output of one of the previous elementary modules.

Such a variant also allows selection by way of multiplexing, as a function of the output signal of the frequency divider, of that one of the signals supplied by the pulse outputs of the elementary modules having a pulse width which will give the greatest precision to the lock-on detection. The selection of the output signal of the frequency divider being realized, for example, by means of a multiplexer controlled by the control signal, this control signal will simultaneously select the best adapted window signal.

Another variant of the invention provides a mode of generating of the window signal in the case where the frequency divider has a different structure than that described hereinbefore. This variant relates to a frequency-selection device as described above, in which the frequency divider comprises:

N elementary modules each having a data input intended to receive an input signal, and a data output intended to supply a signal having a frequency which is K times smaller than that of the signal received at its input, the output of an elementary module being connected to the input of the next elementary module, the input of the first elementary module constituting the first input of the frequency divider, the output of the $N^{th}$ elementary module constituting the output of the frequency divider, each module also having a pulse output intended to supply a signal which, during each period of the output signal of the frequency divider, is active during the first active state of the input signal, and inactive otherwise and, a decoder having an input constituting the second input of the frequency divider, and N outputs each defining the ratio between the frequency of the input signal of an elementary module and that of its output signal, characterized in that the window signal is one of the signals supplied by the pulse outputs of the elementary modules.

In a particularly advantageous embodiment of this variant, such a frequency-selection device is characterized in that it comprises a multiplexer having N data inputs, a control input and a data output, each of the N data inputs being connected to the pulse output of one of the elementary modules of the frequency divider, the decoder having a supplementary output connected to the control input of the multiplexer enabling said multiplexer to supply a window signal at its output, which window signal is constituted by the signal supplied by the pulse output of the $j^{th}$ elementary module, j varying between 1 and N as a function of the control signal.

Such a variant allows selection, by way of multiplexing, of that one of the signals supplied by the pulse outputs of the elementary modules which is to constitute the window signal, and thus the choice of the pulse width of said signal, which defines the precision of the lock-on detection.

In its most general form, the invention also relates to a synchronism detector having a first input intended to receive a first input signal, a second input intended to receive a second input signal, and an output, said detector comprising means for generating a window signal which is active during certain time intervals each including an active edge of the first input signal, and a flip-flop having a data input, a clock input and a data output, the data input being intended to receive the window signal, the clock input being intended to receive the second input signal, and the data output constituting the second output of the synchronism detector.

Such a detector may be advantageously used in all types of systems whose behavior must evolve as a function of the frequency of the signals received at their inputs, such as, for example, modulator/demodulators or adaptive filters.

A variant of such a detector, intended to render it immune to situations in which an active edge of the second signal would occur accidentally during a time interval in which the window signal would be active, without the first and second input signals being in phase with each other, provides a synchronism detector as described above, which is characterized in that it comprises a digital low-pass filter arranged between the data output of the flip-flop and the output of the synchronism detector.

These and other aspects of the invention are apparent from and will be elucidated with reference to the embodiments described hereinafter.

DESCRIPTION OF THE PREFERRED EMBODIMENTS

Figure 1:
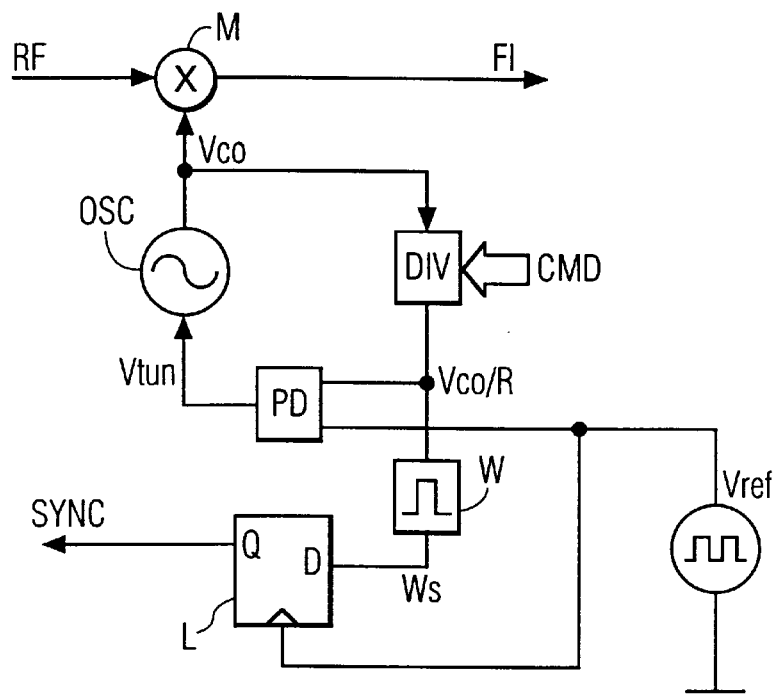
FIG. 1 is a partial functional diagram illustrating a frequency-selection device according to the invention.

FIG. 1 shows, diagrammatically, a frequency-selection device according to the invention. This device has a first input receiving a radio-electric signal RF whose frequency is referred to as radio frequency. This radio-electric signal is selected from a number of signals whose frequencies are situated in a given range. The device also has a second input receiving a control signal CMD defining the frequency of the radio-electric signal to be selected. The device also has a first output supplying a signal FI whose frequency, referred to as intermediate frequency, is fixed. The device also has a second output supplying a signal SYNC indicating that the radio frequency corresponds to the frequency defined by the control signal. The device comprises:

an oscillator OSC having a tuning input receiving a tuning signal Vtun, and an output supplying a signal Vco whose frequency depends on the value of the tuning signal Vtun, a mixer M having a first input constituting the first input of the device and receiving the radio-electric signal RF, a second input connected to the output of the oscillator OSC, and an output constituting the first output of the device and supplying the signal FI whose frequency is equal to the difference between the radio frequency of the signal RF received at the first input and that of the signal Vco received at the second input, a frequency divider DIV having a first input connected to the output of the oscillator OSC, a second input constituting the second input of the device, and an output supplying a signal Vco/R whose frequency is equal to the frequency of the signal received at the first input and, divided by a number defined by the control signal CMD received at the second input, a phase detector PD having a first input receiving a reference signal Vref having a fixed frequency, a second input connected to the output of the frequency divider DIV, and an output connected to the input of the oscillator OSC.

In such a device, the ratio between the frequency of the output signal Vco from the oscillator OSC and that of the output signal Vco/R from the frequency divider, which ratio is denoted R, allows selection of the radio-electric signal RF. Indeed, the intermediate frequency of the signal Fl generated by the mixer M is equal to the difference between the radio frequency and the frequency of the output signal Vco from the oscillator OSC. As the intermediate frequency is fixed, the radio frequency of the radio-electric signal only depends on the frequency of the signal Vco. In a lock-on situation, the frequency of the signal Vco is equal to R times Vref.

The device shown in FIG. 1 also comprises means W for generating a signal Ws, referred to as window signal, which is active during certain time intervals, each including an active edge of the output signal of the frequency divider Vco/R. The device comprises a flip-flop L having a data input D, a clock input and a data output Q, the data input D receiving the window signal Ws, the clock input receiving the reference signal Vref, and the data output Q constituting the second output of the device. The signal SYNC supplied by the data output Q of the flip-flop L indicates the lock-on state when it is at the active level.

An active edge of the output signal Vco/R of the frequency divider DIV may accidentally coincide with an active edge of the reference signal Vref without the device being in a lock-on situation. In such a situation, the device shown in FIG. 1 will set the output signal SYNC of the flip-flop L at the active level and will erroneously signalize a lock-on state. It is desirable to provide the device with filtering means in order to render it immune to such situations.

Figure 2:
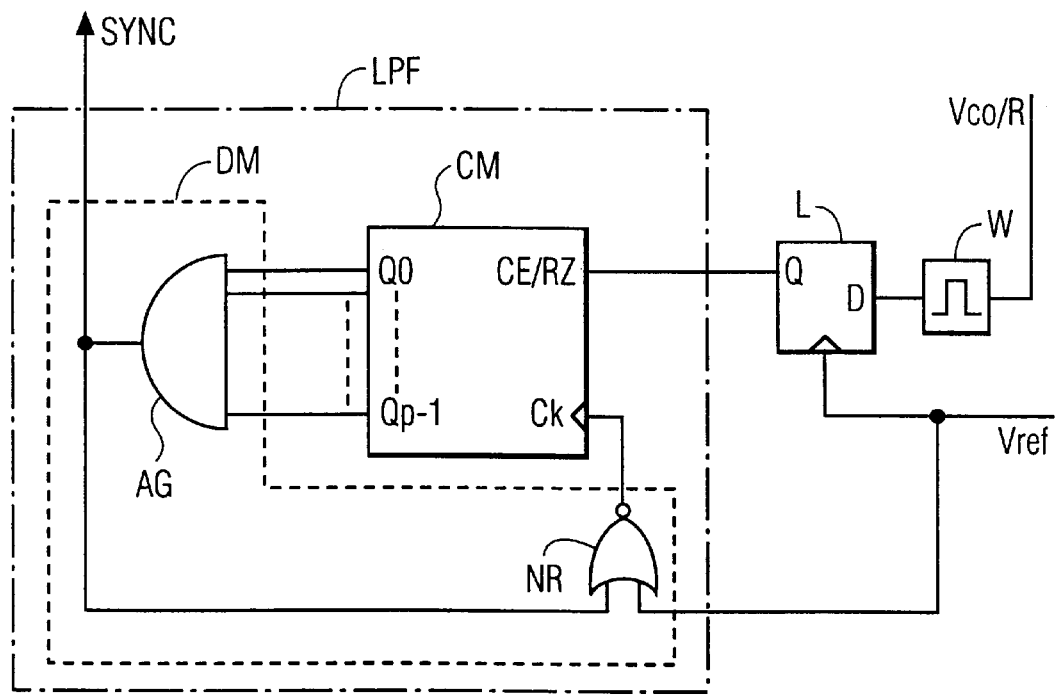
FIG. 2 is a partial functional diagram illustrating a digital low-pass filter in a frequency-selection device in accordance with a variant of the invention.

FIG. 2 shows a digital low-pass filter LPF arranged between the data output Q of the flip-flop L and the second output of the device. In this embodiment, the digital filter comprises:

a modulo-M counter CM having a counting/initialization authorization input CE/RZ connected to the output Q of the flip-flop L, a clock input Ck receiving the reference signal Vref, and P outputs, with $M=2^P$, an active level at the counting/initialization authorization input CE/RZ authorizing the counter CM to count, an inactive level setting each output of the counter CM at the inactive level, a detection module DM having P inputs connected to the P outputs of the counter, and an output constituting the second output of the device, supplying a signal SYNC which is set at the active level when all the outputs of the counter are at the active level and is maintained at this level until the counter receives an inactive level at its counting/initialization authorization input.

The detection module DM includes a logic AND-gate AG having P inputs connected to the P outputs of the counter, and an output supplying the signal SYNC, whose level is active when all the outputs of the counter are at the active level. The detection module DM includes a logic NOR-gate NR having an input connected to the output of the logic AND-gate AG, an input receiving the reference signal Vref, and an output connected to the clock input Ck of the counter CM which thus receives the inverse value of the reference signal Vref when the signal SYNC is at the inactive level. When the counter CM reaches the last state of its counting cycle, in which all its outputs are at the active level, the signal SYNC is at the active level and interrupts, by means of the logic NOR-gate NR, the arrival of clock pulses at the clock input Ck of the counter CM. The counting process is then suspended and the counter CM is maintained in the last state of its counting cycle. In the case of loss of synchronism between the signals Vco/R and Vref, the output Q of the flip-flop L is set at the inactive level and sets all the outputs of the counter CM at the inactive level. The signal SYNC is then set at the inactive level which allows the clock input of the counter CM to again receive the inverse value of the reference signal Vref. The counter can nevertheless only count when the device is in the lock-on state, i.e., when the output Q of the flip-flop L is at an active level again.

Figure 3:
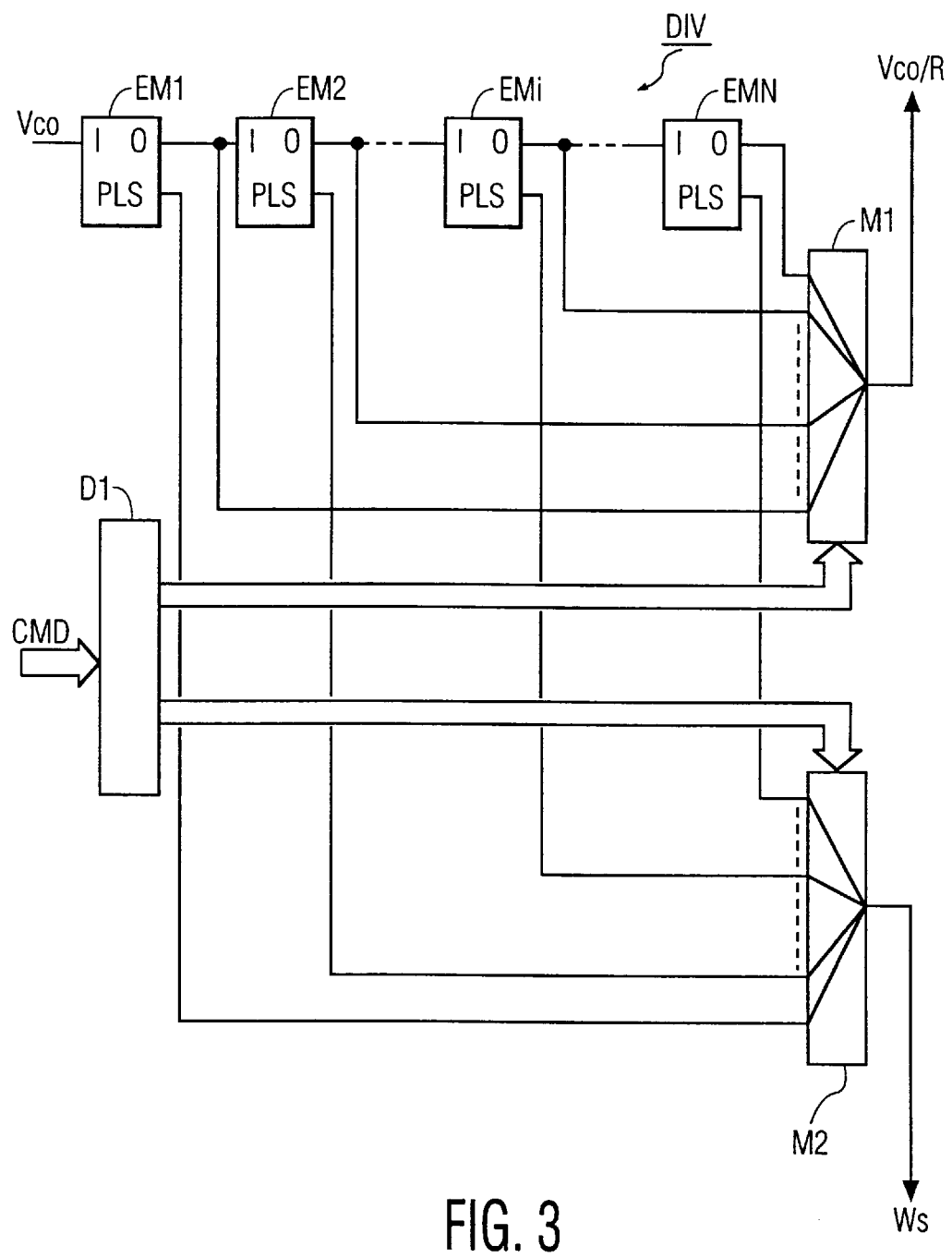
FIG. 3 is a partial functional diagram illustrating a frequency divider in a frequency-selection device in accordance with a variant of the invention.

FIG. 3 shows a mode of generation of the window signal. This FIG. 3 shows, diagrammatically, a frequency divider DIV in a frequency-selection device in accordance with a variant of the invention. This frequency divider DIV is constituted by N modules EM1, EM2, . . . EMN, referred to as elementary modules, which are arranged in cascade, and each has a data input I, a data output O and a pulse output PLS. The input of the first elementary module EM1 constitutes the first input of the frequency divider DIV. Each elementary module operates a frequency division and supplies, at its data output O, a signal resulting from this division and, at its pulse output PLS, a signal which, during each period of the output signal Vco/R of the frequency divider DIV, is active during the first active state of the input signal, and inactive otherwise. If, for example, these elementary modules are flip-flops, each module will effect a division by two. The output of the $i^{th}$ elementary module, in which i may vary between 1 and N, is selected by means of the control signal CMD received at the second input of the frequency divider DIV for constituting the output of said divider. This selection is realized here by means of a first multiplexer M1 which has N data inputs each connected to the output of an elementary module, a control input and a data output constituting the output of the frequency divider DIV and supplying the signal Vco/R. The frequency divider DIV comprises a decoder D1 having an input, a first output and a second output, the input of the decoder D1 receiving the control signal CMD, the decoder D1 supplying from its first output a control signal enabling the first multiplexer M1 to select that one of the outputs of the elementary modules which will constitute the output of the frequency divider DIV. This output-multiplexing system allows the adjustment of the ratio R between the frequency of the input signal Vco of the frequency divider and that of its output signal Vco/R. If the elementary modules are flip-flops, and if the output of the $i^{th}$ elementary module EMi is selected for constituting the output of the frequency divider DIV, the frequency of the output signal Vco/R will be 2i times smaller than that of the input signal Vco(R=2i). The frequency divider DIV shown in FIG. 3 also comprises a second multiplexer M2 which has N data inputs each connected to the pulse output PLS of an elementary module, a control input and a data output supplying the window signal Ws. The decoder D1 supplies from its second output a control signal enabling the second multiplexer M2 to select, among the signals supplied by the pulse outputs of the i first elementary modules, the signal which will constitute the window signal Ws. The decoder D1 can thus adapt the pulse width of the window signal Ws to that of the output signal Vco/R of the divider DIV.

Figure 4:
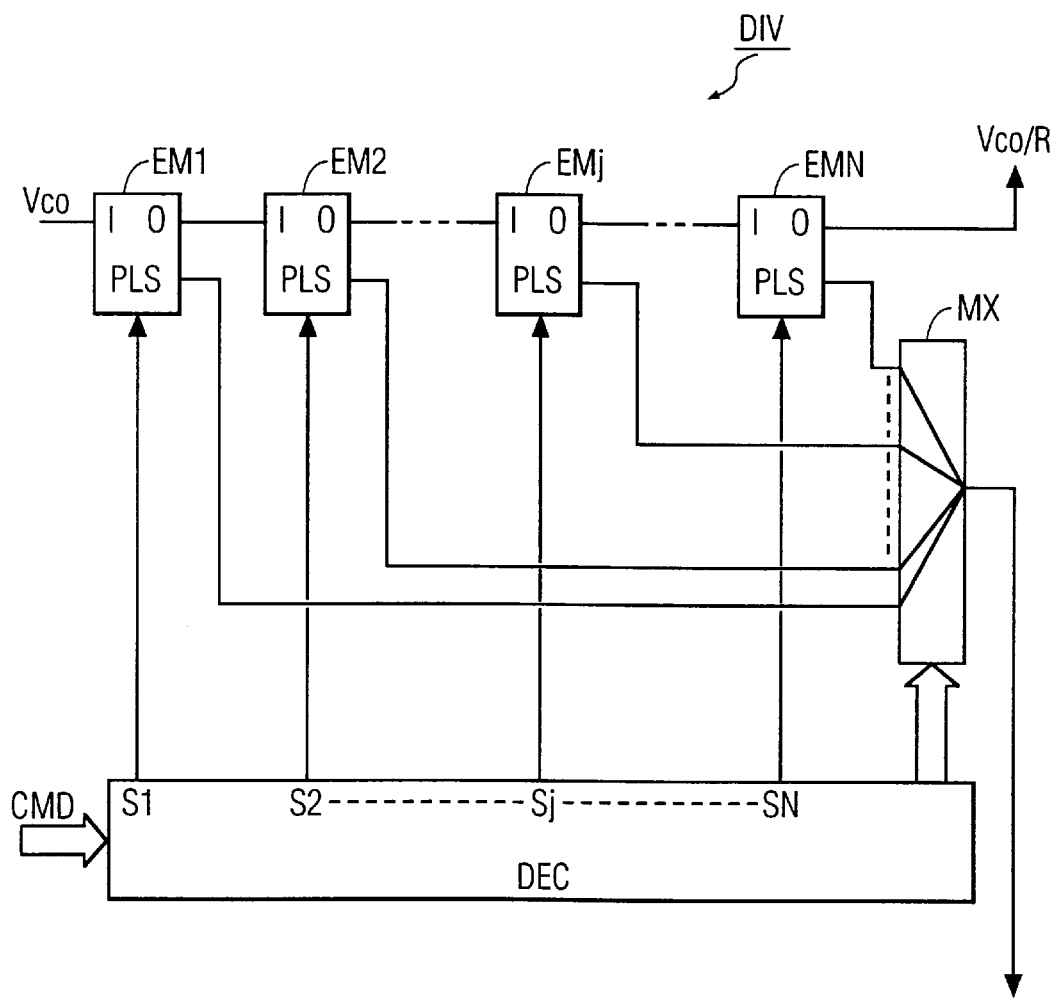
FIG. 4 is a partial functional diagram illustrating a frequency divider in a frequency-selection device in accordance with another variant of the invention.

FIG. 4 shows, diagrammatically, a frequency divider DIV in a frequency-PHF selection device in accordance with another variant of the invention. This frequency divider DIV comprises:

N elementary modules EM1, EM2, . . . EMN, each having a data input I receiving an input signal, and a data output O supplying a signal having a frequency which is K times smaller than that of the signal received at its input, the output O of an elementary module being connected to the input I of the next elementary module, the input I of the first elementary module EM1 constituting the first input of the frequency divider DIV, the output O of the $N^{th}$ elementary module EMN constituting the output of the frequency divider DIV, each module also having a pulse output PLS supplying a signal which, during each period of the output signal Vco/R of the frequency divider DIV, is active during the first active state of the input signal, and inactive otherwise and, a decoder DEC having an input constituting the second input of the frequency divider, and N outputs, S1, S2, . . . SN, each defining the ratio K between the frequency of the input signal of an elementary module and that of its output signal. In such a frequency divider, and contrary to that described hereinbefore, it is not the choice of the output of one of the elementary modules which defines the ratio R between the frequency of the input signal of the divider and that of its output signal. In this case, the adjustment of this ratio R is realized by acting directly on the ratio K of each elementary module, and R is equal to the sum of these ratios (R=K1+K2+. . .+KN). The divider DIV also comprises a multiplexer MX having N data inputs, a control input and a data output, each of the N data inputs being connected to the pulse output PLS of one of the elementary modules EM1, EM2, . . . EMN of the frequency divider DIV, while the decoder DEC has a supplementary output which is connected to the control input of the multiplexer MX, enabling this multiplexer to supply a window signal Ws to its output, which window signal Ws is constituted by the signal supplied by the pulse output of the $j^{th}$ elementary module, in which j varies between 1 and N as a function of the control signal. Such a system allows adaptation of the pulse width of the window signal Ws to that of the output signal Vco/R of the divider.

Figure 5:
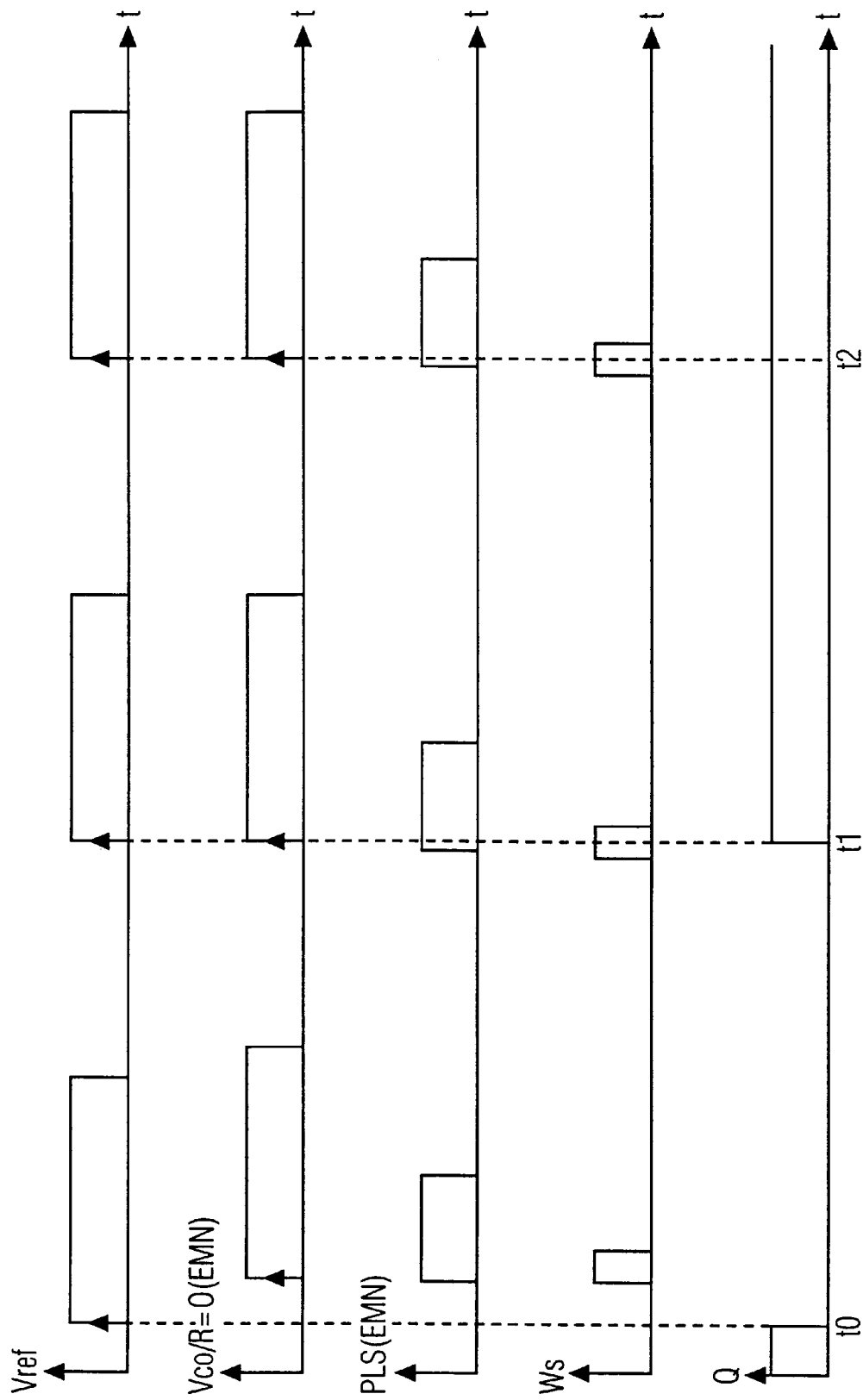
FIG. 5 is a set of chronograms illustrating the waveform of signals in a frequency-selection device in accordance with this other variant of the invention.

FIG. 5 shows the waveform of signals in a device comprising such a frequency divider. The signal Vref has a fixed frequency which corresponds to a period T. The output O(EMN) of the $N^{th}$ elementary module EMN of the frequency divider DIV supplies the output signal Vco/R of this divider. The output signal, denoted O(EMN), of the elementary module EMN is delayed with respect to the signal which it receives at the input, which is the output signal from the previous elementary module, EMN-1, and also with respect to the signal, denoted PLS(EMN), which is supplied by the pulse output of EMN. This delay is intrinsic to the elementary module and corresponds to a transit time of the electric signal between the input and the output of the elementary module. In the example described here, the last module EMN divides the frequency by two (KN=2). The signal Ws is the signal supplied by the pulse output of one of the modules preceding the elementary module EMN. With respect to the signal Ws, the delay of Vco/R is even larger, as being equal to the sum of delays brought about by the elementary modules which separate the output of the frequency divider from the elementary module whose pulse output supplies the window signal Ws. The pulse width of the window signal Ws is evidently smaller than that of PLS(EMN). The window signal Ws thus frames the active edge of the output signal Vco/R of the frequency divider.

FIG. 5 shows the case where Vref and Vco/R have synchronous active edges at the instant T-t0, which is not shown in the FIG. 5, which has had the effect that the data output Q of the flip-flop L was set at the active level. At the instant t0, which corresponds to an active edge of Vref, Vco/R and Vref are no longer synchronous. The window signal Ws, which is present at the data input D of the flip-flop L, is then at the inactive level during the active edge of Vref, and the output Q of the flip-flop L is set at the inactive level. At the instant t1, Vco/R and Vref are synchronous. The window signal Ws is then at the active level during the active edge of Vref, and the output Q of the flip-flop L is set at the active level. At the instant t2, Vco/R and Vref are still synchronous. The output Q of the flip-flop L thus remains at the active level.

Figure 6:
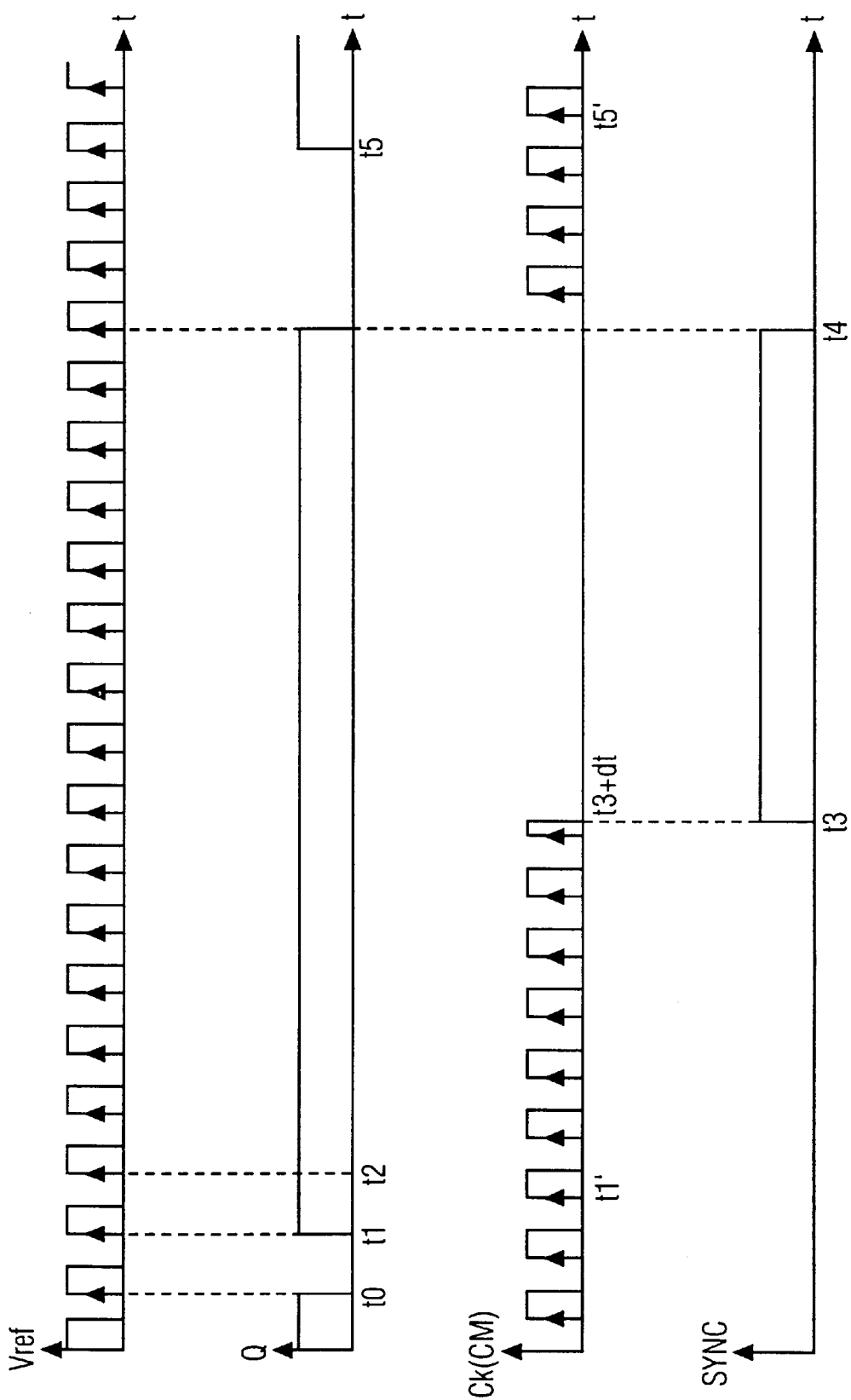
FIG. 6 is a set of chronograms illustrating the waveform of the signals in a frequency-selection device comprising a low-pass filter.

FIG. 6 shows the waveform of the signals in a frequency-selection device comprising a low-pass filter as shown in FIG. 2. The time scale is larger with respect to that of FIG. 5 so as to enable one to observe the filtering effects. In this particular case, the counter CM is a modulo-8 counter. Similarly as described above, the signals Vco/R and Vref are not synchronous at the instant t0. The data output Q of the flip-flop L is thus set at the inactive level which is transmitted to the counting/initialization authorization input CE/RZ of the counter CM. All of its outputs are then at the inactive level. As from t1, the signals Vco/R and Vref are synchronous. The counter CM thus starts its counting cycle at the instant t1' which is shifted with respect to t1 by half a period of the signal Vref because of the inversion of this signal by the logic NOR-gate NR, which cycle ends at t3 when the seventh active edge occurs at the clock input Ck(CM) of the counter CM. The output signal SYNC of the logic AND gate AG is then set at the active level and sets the output of the logic NOR-gate NR at the inactive level, thus suspending, from t3+dt, the arrival of clock pulses at the clock input Ck(CM) of the counter CM, which is thus maintained in the last state of its counting cycle. The delay dt is due to the transit time through the logic And-gate AG and the logic NOR-gate NR. Consequently, the signal SYNC is maintained at the active level. At the instant t4, the signals Vco/R and Vref are no longer synchronous. The data output Q of the flip-flop L is then set at the inactive level, thus resetting all the outputs of the counter CM, and hence, the signal SYNC, to the inactive level. The clock input Ck(CM) of the counter CM then receives the clock pulses again, but the counter does not resume its counting cycle as it is in the situation of initialization as long as the output Q of the flip-flop L remains at the inactive level. At the instant t5, the signals Vco/R and Vref are synchronous again. The data output Q of the flip-flop L is therefore set at the active level, thus authorizing the counter CM to start its counting cycle at the instant t5' which is shifted with respect to t5 by half a period of the signal Vref. The fact that before t0, the clock input Ck(CM) of the counter CM received clock pulses proves that the synchronism between the two signals Vco/R and Vref had been too short to enable the operate to operate a complete counting cycle, at the end of which its clock input would have been inhibited. The association of the counter CM and the detection module DM is thus equivalent to a low-pass filter, which only takes into account active states having a duration which is larger than or equal to seven periods of the reference signal Vref in this example.

FIGS. 5 and 6 show signals for which the active level is the logic level "1" and the inactive level is the logic level "0". Similarly, the active edges are rising edges. The description given hereinbefore can easily be transposed to the case where the active level would be the logic level "0", the inactive level the logic level "1" and the active edges falling edges.

I claim:

1. A frequency-selection device having a first input for receiving a radio-electric signal having a frequency referred to as a radio frequency, this radio-electric signal being selected from a number of signals having frequencies which are situated in a given range, said frequency-selection device having a second input for receiving a control signal defining the frequency of the radio-electric signal to be selected, a first output for supplying a signal having a fixed frequency, referred to as intermediate frequency, and a second output for supplying a signal indicating that the radio frequency corresponds to the frequency defined by the control signal, said frequency-selection device comprising:

an oscillator having a tuning input for receiving a tuning signal, and an output for supplying a signal having a frequency which depends on the value of the tuning signal;

a mixer having a first input, constituting the first input of the frequency-selection device, for receiving the radio-electric signal, a second input connected to the output of the oscillator, and an output, constituting the first output of the device, for supplying a signal having a frequency which is equal to a difference between the frequency of the signal received at the first input and the frequency of the signal received at the second input;

a frequency divider having a first input connected to the output of the oscillator, a second input constituting the second input of the frequency-selection device, and an output for supplying a signal having a frequency which is equal to the frequency of the signal received at the first input, divided by a number defined by the control signal received at the second input; and a phase detector having a first input for receiving a reference signal having a fixed frequency, a second input connected to the output of the frequency divider, and an output connected to the input of the oscillator, characterized in that the device also comprises:

means for generating a window signal which is active during certain time intervals each including an active edge of the output signal of the frequency divider; and a flip-flop having a data input, a clock input and a data output, the data input receiving the window signal, the clock input receiving the reference signal, and the data output constituting the second output of the device.

2. A frequency-selection device as claimed in claim 1, characterized in that the frequency-selection device comprises a digital low-pass filter arranged between the data output of the flip-flop and the second output of the device.

3. A frequency-selection device as claimed in claim 2, characterized in that the digital filter comprises:

a modulo-M counter having a counting/initialization authorization input connected to the output of the flip-flop, a clock input for receiving the reference signal, and P outputs, with $M=2^P$, an active level at the counting/initialization authorization input authorizing the counter to count, an inactive level at the counting/initialization authorization input setting each output of the counter at an inactive level; and a detection module having P inputs connected to the P outputs of the counter, and an output, constituting the second output of the device, for supplying a signal which is set at an active level when all the outputs of the counter are at an active level, said signal being maintained at this level until the counter receives an inactive level at its counting/initialization authorization input.

4. A frequency-selection device as claimed in claim 1, in which the frequency divider is composed of N elementary modules arranged in cascade and each having a data input, a data output and a pulse output, the input of the first elementary module constituting the first input of the frequency divider, each elementary module performing a frequency division and supplying a signal resulting from this division at the respective data output, and, at the respective pulse output, a signal which, during each period of the output signal of the frequency divider, is active during the first active state of the input signal, and inactive otherwise, characterized in that, if the output of the $i^{th}$ elementary module, in which I may vary between 1 and N, is selected by means of the control signal received at the second input of the frequency divider for forming the output of said divider, the window signal is one of the signals supplied to the pulse output of one of the I first elementary modules.

5. A frequency-selection device as claimed in claim 1, in which the frequency divider comprises:

N elementary modules each having a data input for receiving an input signal, and a data output for supplying a signal having a frequency which is K times smaller than that of the signal received at the data input, the data output of an elementary module being connected to the data input of a next elementary module, the data input of the first elementary module constituting the first input of the frequency divider, the data output of the $N^{th}$ elementary module constituting the output of the frequency divider, each of said N elementary modules also having a pulse output for supplying a signal which, during each period of the output signal of the frequency divider, is active during the first active state of the input signal, and inactive otherwise; and a decoder having an input constituting the second input of the frequency divider, and N outputs each defining the ratio K between the frequency of the input signal of an elementary module and that of its output signal, characterized in that the window signal is one of the signals supplied by the pulse outputs of the elementary modules.

6. A frequency-selection device as claimed in claim 5, characterized in that the frequency-selection device further comprises a multiplexer having N data inputs, a control input and a data output, each of the N data inputs being connected to the pulse output of one of the elementary modules of the frequency divider, the decoder having a supplementary output connected to the control input of the multiplexer enabling said multiplexer to supply a window signal at the data output, said window signal being constituted by the signal supplied by the pulse output of the $j^{th}$ elementary module, j varying between 1 and N as a function of the control signal.

7. A synchronism detector having a first input for receiving a first input signal, a second input for receiving a second input signal, and an output, said synchronism detector comprising:

means for generating a window signal which is active during certain time intervals each including an active edge of the first input signal; and a flip-flop having a data input, a clock input and a data output, the data input receiving the window signal, the clock input receiving the second input signal, and the data output constituting the second output of the synchronism detector.

8. A synchronism detector as claimed in claim 7, characterized in that said synchronism detector further comprises a digital low-pass filter arranged between the data output of the flip-flop and the output of the synchronism detector.

* * * * *